United States Patent
Frenette et al.

[11] Patent Number: 6,028,339
[45] Date of Patent: Feb. 22, 2000

[54] DUAL WORK FUNCTION CMOS DEVICE

[75] Inventors: Robert O. Frenette, Burlington; Dale P. Hallock, Bristol; Stephen A. Mongeon, Essex Junction; Anthony C. Speranza, Essex Junction; William R. P. Tonti, Essex Junction, all of Vt.

[73] Assignee: International Business Machines Corporation, Armonk, N.Y.

[21] Appl. No.: 09/211,565

[22] Filed: Dec. 14, 1998

Related U.S. Application Data

[60] Continuation-in-part of application No. 08/963,996, Nov. 4, 1997, abandoned, which is a division of application No. 08/705,579, Aug. 29, 1996, Pat. No. 5,770,490.

[51] Int. Cl.[7] .......................... H01L 29/76; H01L 29/94; H01L 31/062; H01L 31/113; H01L 31/119
[52] U.S. Cl. .......................... 257/364; 257/344; 257/346; 257/408; 257/900
[58] Field of Search .................. 257/344, 346, 257/408, 900, 369

[56] References Cited

U.S. PATENT DOCUMENTS

| | | |
|---|---|---|
| 4,755,478 | 7/1988 | Abernathe et al. . |
| 5,024,960 | 6/1991 | Haken . |
| 5,190,888 | 3/1993 | Schwalke et al. . |
| 5,234,850 | 8/1993 | Liao .......................... 437/44 |
| 5,254,866 | 10/1993 | Ogog ....................... 257/367 |
| 5,258,645 | 11/1993 | Salo ........................ 257/637 |
| 5,274,261 | 12/1993 | Chen ....................... 257/344 |
| 5,324,974 | 6/1994 | Liao ........................ 257/344 |
| 5,329,138 | 7/1994 | Mitani et al. . |
| 5,464,789 | 11/1995 | Saito . |
| 5,465,000 | 11/1995 | Williams . |
| 5,468,986 | 11/1995 | Yamamashi ............. 257/389 |
| 5,729,056 | 3/1998 | Sung . |

FOREIGN PATENT DOCUMENTS

| | | |
|---|---|---|
| 58-197072 | 11/1983 | Japan . |
| 60-197072 | 10/1985 | Japan . |
| 63-104325 | 5/1988 | Japan . |
| 2-188913 | 7/1990 | Japan . |
| 2-188914 | 7/1990 | Japan . |
| 4-92416 | 3/1992 | Japan . |

OTHER PUBLICATIONS

IBM Technical Disclosure Bulletin\vol. 31 No. 7\Dec. 1988\Dual Work Function Doping.
IBM Technical Disclosure Bulletin\vo. 26 No. 10A\Mar. 1984\Oxidizable P–Channel Gate Electrode.
Dialog 1996 Derwent Info, Ltd.\Mar. 1996\p. 2\JP 6283725. BU889–0198\Low Reistivity Stack for Dual Doped Polysilicon Gate Electrode\Jun. 1991. No. 326\Kenneth Mason Publications Ltd., England.

*Primary Examiner*—Ngân V. Ngô
*Attorney, Agent, or Firm*—Schmeiser, Olsen & Watts; Howard J. Walter, Jr.

[57] ABSTRACT

A dual work function CMOS device and method for producing the same is disclosed. The method includes: depositing a first layer of a doped material, either n-type or p-type, over a substrate to be doped; defining the areas that are to be oppositely doped; depositing a second layer of an oppositely doped material over the entire surface; and subjecting the entire CMOS device to a high temperature, drive-in anneal. The drive-in anneal accelerates the diffusion of the dopants into the adjacent areas, thereby doping the gate polysilicon and channels with the desired dopants. A nitride barrier layer may be utilized to prevent the second dopant from diffusing through the first layer and into the substrate beneath.

16 Claims, 3 Drawing Sheets

DUAL WORK FUNCTION CMOS DEVICE

The present patent application is a continuation-in-part of copending U.S. patent application Ser. No.: 08/963,996, filed Nov. 4, 1997, and entitled Dual Work Function CMOS Device and Method For Producing the Same, now abandoned which is a divisional patent application Ser. No. 08/705,579 filed Aug. 29, 1996, now of U.S. Pat. No. 5,770,490, issued Jun. 23, 1998, and entitled Dual Work Function CMOS Device and Method For Producing the Same.

BACKGROUND OF THE INVENTION

1. Technical Field

This invention relates generally to a method of manufacturing integrated circuit (IC) chips and the IC chips produced thereby. More specifically, the present invention relates to a dual work function complementary metal oxide semiconductor (CMOS) device and a method for producing these devices.

2. Background Art

Presently, integrated circuit chips are manufactured by beginning with a wafer. If desired, these wafers may be grown with a given type of impurity, depending upon whether one desires electron acceptors (p-type impurities) or electron donors (n-type impurities) in the wafer.

One of the first processing steps of the wafer in forming an integrated circuit (IC) chip is the creation of device isolation. Shallow trench isolation areas may be formed by defining areas with a photoresist and reactive ion etching to form the shallow trenches. The shallow trenches are then filled with a nonreactive silicon oxide and planarized by a chemical mechanical polish. In some cases, a nitride liner, conventionally a silicon nitride, may be deposited before the oxide, so as to prevent oxidation of the surrounding areas.

Wells are then implanted in the wafer of either or both of the impurities. For example, if one begins with a p-type wafer, n-wells would be implanted. The gate oxide is grown and the various layers of the gate are deposited. A resist is then applied and the gate defined by the standard reactive ion etch method. Another resist layer is used to define the p-extensions, a lightly doped drain is formed, and the resist is removed. The same process is used to form the n-type lightly doped drain regions. The sidewall oxide or spacer is then applied and the source/drain implantation is performed. The space between the gates is then filled and the surface planarized. The aspect ratio of these gates is optimized to approach a value of 1, so that the thinner the gate layers are, the more easily filled the areas between them, the more reliable the metallization process and, hence, the more reliable the chips.

Each set of a gate, a source, a drain and a well forms a field effect transistor (FET). If the source and drain are N+, the FET is known as an NFET and, conversely, if the source and drain are P+, the FET is known as a PFET. In a single work function CMOS device, the gate is doped with a single impurity type. In a dual work function CMOS device, both NFET and PFET devices have their gate dopants tailored in order to achieve an enhanced p-channel device characteristic. This means that each time an area must be implanted with an n-type impurity, the areas that are free of impurities and the areas which are going to be doped with p-type impurities must be protected and vice versa. This leads to a multiplication of the alignment problems involved with each resist patterning step and increased throughput time because of the additional definition steps and two separate implantation steps.

This technique also suffers from limitations inherent in the conventional implantation method. Ion implantation may give rise to dislocations. The generation of dislocations provide paths for leakage of charge out of the wells that store charge in DRAM cells and across junctions. For example, normal VLSI processing conditions usually requires a high dose ion implant, such as the $BF_2$ ion implant used for p-channel source-drain (S/D) doping (in 0.5 micron technology). This may cause the formation of extended loop dislocations. Should dislocations occur, the chip fails, therefore, it is desirable to prevent the formation of these dislocations.

SUMMARY OF THE INVENTION

The present invention provides a method and an integrated circuit chip produced by the method for doping the source and drain diffusions as well as the gate polysilicon by a high temperature anneal, i.e., without using high dose ion implantation. This is accomplished by depositing a first layer of a material containing a first type of impurity, selectively removing portions of the first layer, depositing a second layer of material containing a second type of impurity and then heating to cause diffusion of the impurities into the underlying layer. As can be seen, the first layer acts as barrier layer, so the species from the second layer are diffused into the first layer and no further.

Accordingly, the need for the high dose ion implant process step is avoided, significantly reducing the possibility of dislocations and the chip failure associated with dislocations.

Another feature of the present invention is that the need for a layer of photoresist and the associated masking and processing steps are obviated. By eliminating the second photoresist step, alignment problems are not multiplied and throughput time is reduced.

The foregoing and other features and advantages of the invention will be apparent from the following more particular description of preferred embodiments of the invention, as illustrated in the accompanying drawings.

BRIEF DESCRIPTION OF THE DRAWINGS

The preferred exemplary embodiment of the present invention will hereinafter be described in conjunction with the appended drawings, where like designations denote like elements, and.

BEST MODES FOR CARRYING OUT THE INVENTION

Figure 1:
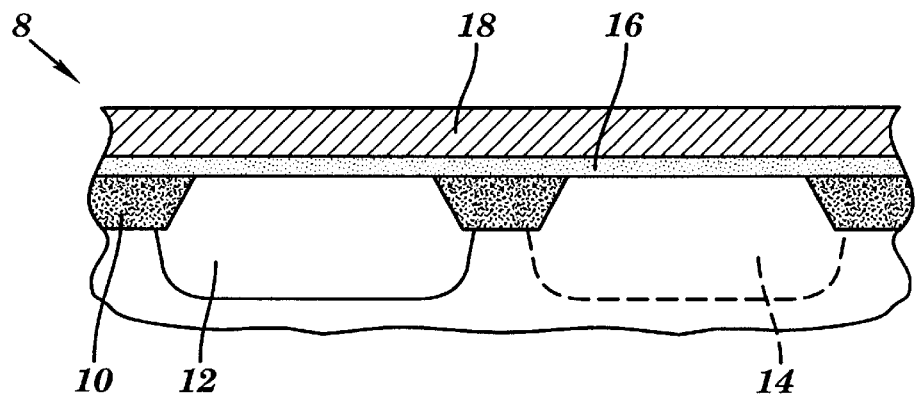
FIG. 1 is a schematic of a first step in the process of the present invention.

Referring to the FIGS. 1–6, there is shown a stepwise series of schematic views of the process and integrated circuit (IC) chip 8 of preferred embodiments of the present invention. A cross section of the IC chip 8 is shown in FIG. 1. The chip 8 itself is typically a P+ substrate, in which isolation areas may have been formed, either shallow trench isolation areas 10 or semi-recessed oxide isolation (S-ROX) structures. Between these areas, active areas are formed. The active areas commonly include n-wells 12, p-wells 14, or the doped substrate itself. The well structures 12,14 are implanted in the usual fashion and then a gate oxide 16 is grown on the surface. On top of gate oxide layer 16, an undoped polysilicon 18 layer is deposited to form the structure shown in FIG. 1.

Figure 2:
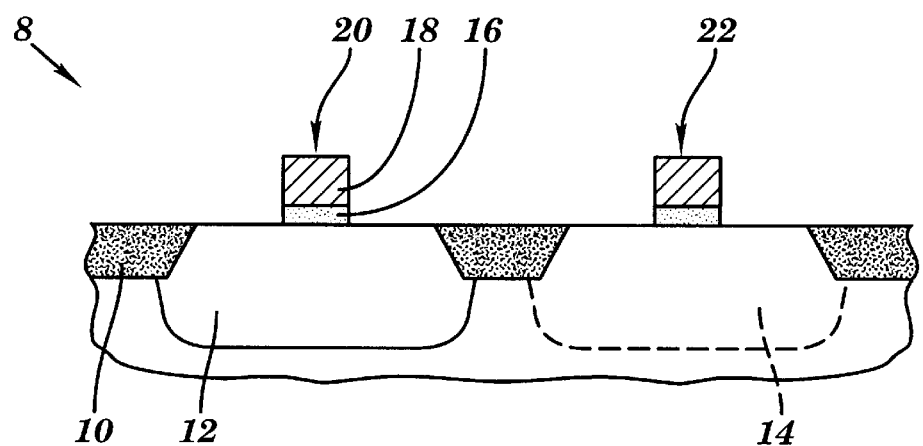
FIG. 2 is a schematic of a second step in the process of the present invention.

As shown in FIG. 2, gates 20, 22 are defined using the conventional method, which comprises depositing a layer of a photosensitive material, known as a resist, exposing the photosensitive material to an energy source, e.g., e-beams, i-line or deep ultraviolet light, or X-rays, thereby changing the solubility of the resist so that it is either more soluble in the energy struck regions (positive resist) or less soluble in the areas the light strikes (negative resist), developing the resist, which basically comprises rinsing off the more-soluble areas, and subjecting the entire surface to a reactive ion etch process in which the areas that are not protected by a layer of resist material are etched away. Hereinafter, this entire "expose, develop, etch" process will be referred to as "defining" an area. The resist material is then removed and the resulting structure is shown in FIG. 2. Gates, 20, 22, are on the substrate surface over the active areas.

At this point, spacers 24, 26 (FIG. 6) may optionally be formed. The spacer material is deposited as a layer of an insulative material, either a nitride or an oxide depending on the device, and anisotropically reactive ion etched on the entire surface until the horizontal portions have been etched away, leaving the areas that are on the sidewalls of gates 20 and 22 to form spacers 24, 26.

Figure 3:
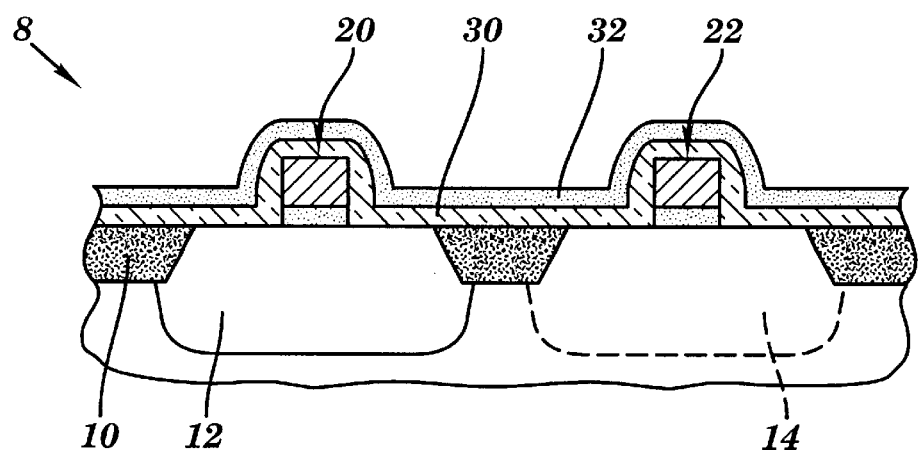
FIG. 3 is a schematic of a third step in the process of the present invention.

As shown in FIG. 3, first layer 30, containing a first type of impurity, is deposited over the entire surface. The first type of impurity may either be an n-type or a p-type impurity. If first layer 30 contains an n-type impurity, the material is commonly either a phosphosilicate glass (PSG) or an arsenic silicate glass (ASG). The arsenic doped glass is used in place of the phosphorus doped glass because it may offer advantages, such as differences in diffusivity. If first layer 30 contains a p-type impurity, the material is commonly borosilicate glass (BSG). In FIG. 3, first layer 30 is BSG, i.e., a p-doped silicate glass. A nitride layer 32 or other protective layer may then be deposited on the surface of first layer 30 to prevent diffusion of subsequent dopants through this first layer. If nitride layer 32 is not used, the thickness of first layer 30 must be controlled to prevent the diffusion of subsequent dopants through first layer 30. However, in such an embodiment, the bulk of first layer 30 may cause complications in the patterning of the device.

Figure 4:
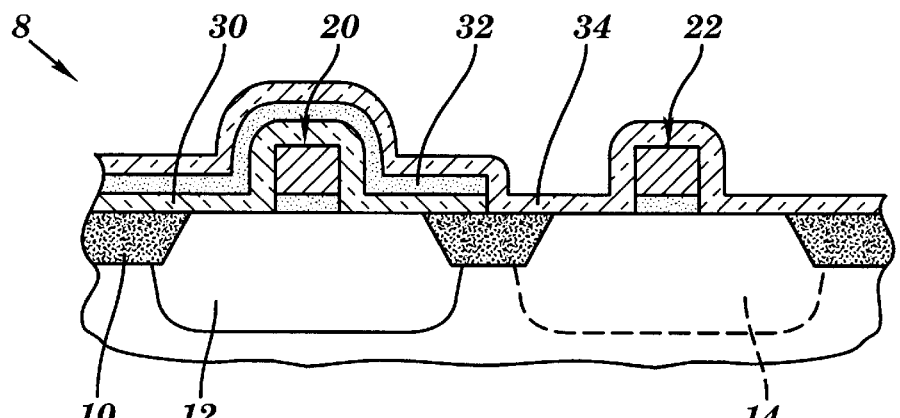
FIG. 4 is a schematic of a fourth step in the process of the present invention.

The first layer 30 is then defined, by blocking the P-channel devices with the photoresist and performing a wet etch using buffered hydrofluoric acid (BHF) to remove the BSG from the N-channel devices. Obviously, if the n-type impurity were chosen as the first layer 30, the layer would be defined so that the glass (PSG or ASG) would remain on the areas to be doped with the n-type impurity. The resist is then stripped off, the surface prepared for the next step by a reduced etch in hydrofluoric acid (HF) solution, and a second layer 34 having a second impurity is deposited on the surface, as shown in FIG. 4. Second layer 34, similar to first layer 30 and protective layer 32, is a conformal coating over the entire surface.

Figure 5:
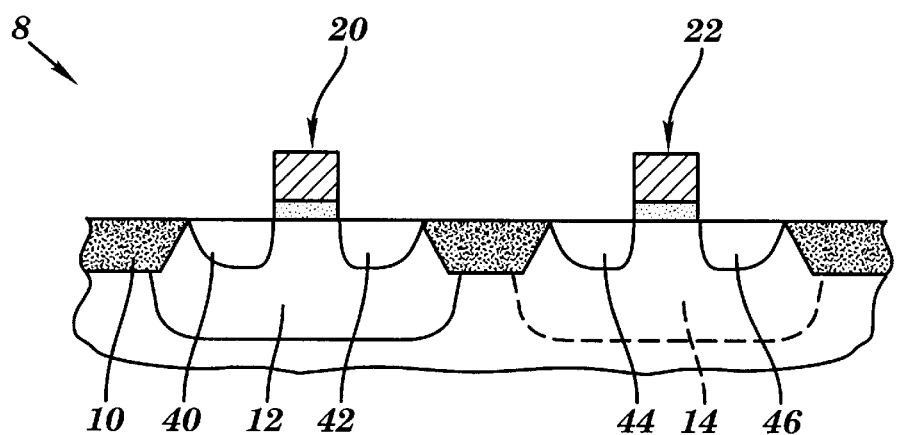
FIG. 5 is a schematic of the final product of the present invention.

The entire structure is then subjected to conditions necessary to perform a drive-in anneal, to arrive at the final product as shown in FIG. 5. A first source 40 and a first drain 42 having p-type impurities are formed in the n-well 12. A second source 46 and a second drain 44 having n-type impurities are formed in the p-well 14. Together a source and drain form a junction so that there is one junction for each well and defined gate. This is preferably performed for a sub-0.1 micron(gm) scale device by heating the entire structure to a temperature in the range of about 850° Celsius (C) to about 1100° C. for approximately 10 seconds (sec.) in a rapid thermal anneal (RTA) tool. The amount of time necessary and the optimal temperature will vary depending on the device to be fabricated and the corresponding structure needed. For example, if the anneal is performed for a longer time and/or at a higher temperature, the dopant will be driven deeper into the material below and will have a more gradual concentration gradient. Conversely, as the time and/or temperature of the anneal process (DT) is reduced, the overlap of the gate is varied. In this CMOS process, the need for a spacer to define diffusion overlap is optional. In general, the DT process provides ample process window for diffusion overlap.

Figure 6:
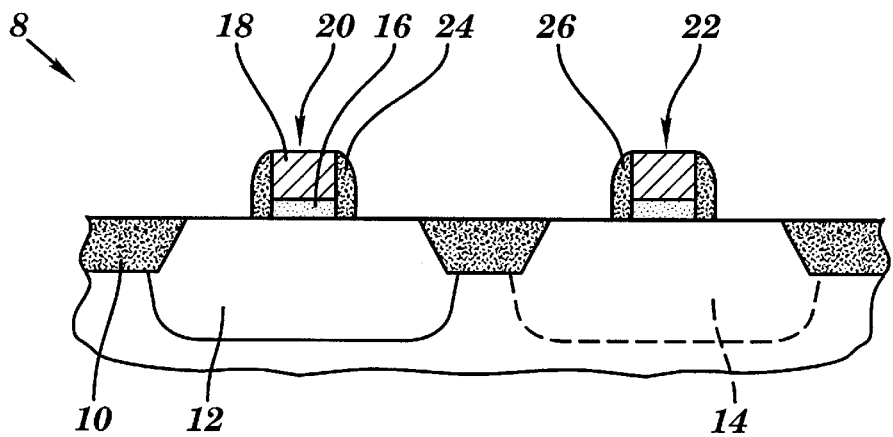
FIG. 6 is an alternative schematic of the second step in the process of the present invention.
Figure 7:
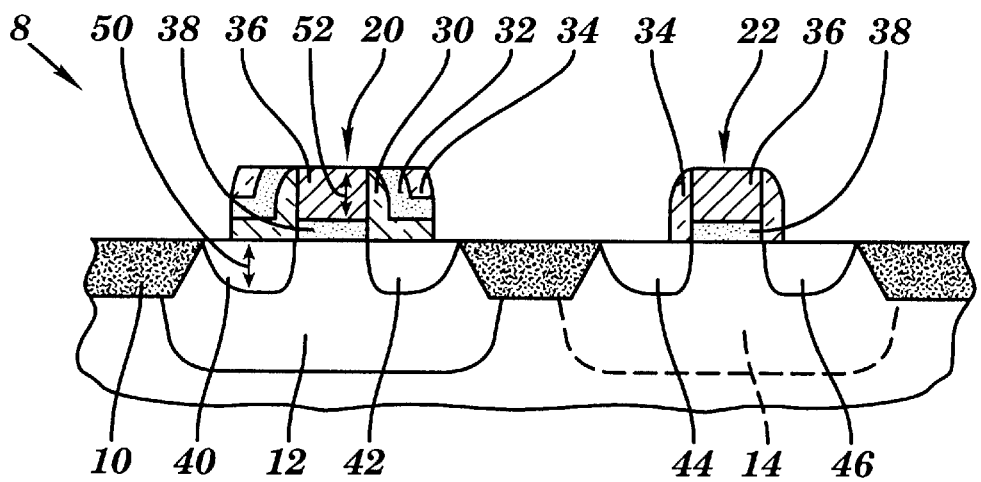
FIG. 7 is an alternative schematic of the final product of the present invention.

Gate electrode 36 is degeneratively doped either P+ or N+ due to the rapid movement of dopant in a polycrystalline structure. The gate electrode thickness (which ultimately governs its geometric control) is now not limited by the penetration of high energy implants and can be scaled to sub-0.1 $\mu$m. Specifically, gate electrodes 36 are scaled in height to the junction heights. As shown in FIGS. 6 and 7, gate electrode height 52 is substantially similar to junction height 50. The optimal height for gate electrode is in the range of about 500 to about 1500 angstroms.

Figure 8:
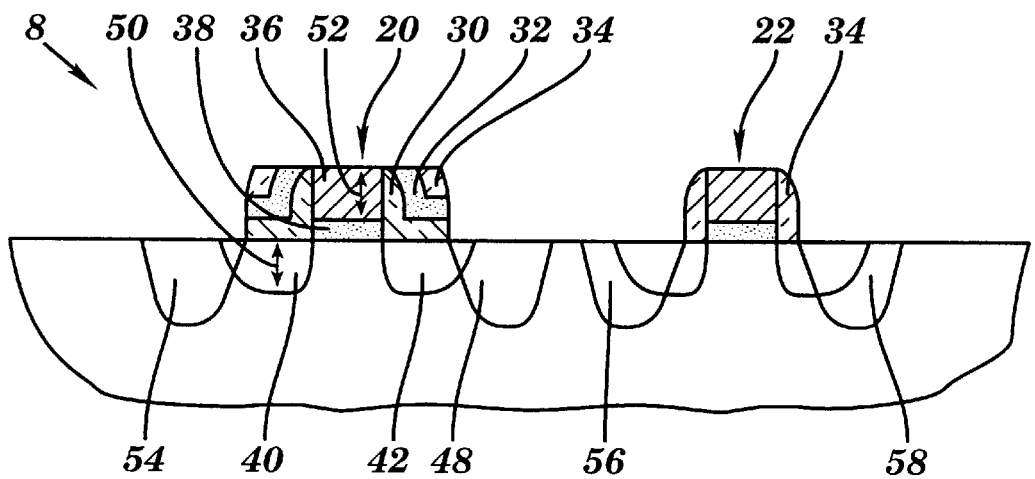
FIG. 8 is a second alternative schematic of the final product of the present invention.

In the case where the junctions are scaled narrowly (e.g. 100 angstroms), the contacts which are etched may penetrate into the silicon. The result of this is damage through the junction, commonly referred to as spiking. To alleviate this problem, a deeper junction can be implanted for contact. As shown in FIG. 8, a second set of junctions, comprised of sources 54 and 58 and drains 48 and 56 have been implanted deeper into the IC chip than the first set of junctions.

The dopant layers may then be removed and the final product may be processed using the regular back end of the line processing steps. Alternatively, the layers could be anisotropically etched to form spacers if they weren't formed previously or defining a cheaper process, such as a tetraethylorthosilicate glass spacer, to minimize diffusion and gate parasitic capacitance if a second high dose source-drain doping step is to be employed. A third option would be to not remove dopant source layers at all. The BSG/PSG (ASG) layers could remain intact on the devices if self aligned silicide were not to be employed. This would be desirable for ultra low power CMOS applications.

As shown in FIGS. 6 and 7, the layers have been etched to form spacers. Specifically, first layer 20, protective layer 32, and second layer 34 are allowed to remain along the sidewalls of gate 20, whereas second layer 34 is allowed to remain as a spacer along the sidewalls of gate 22. It should be realized, however, that although a particular embodiment has been described, the form and extent to which layers 30, 32 and 34 remain may vary. For example, protective layer 32 and second layer 34 can be removed from gate 20 leaving only first layer 30 as a spacer.

In another option, the use of a spun on glass (SOG) may be substituted for either or both of the BSG and PSG or ASG films. Doped SOG is commercially available with either boron, phosphorus, or arsenic and may be utilized if it is necessary or desirable because of other design and technology constraints.

As is apparent from this disclosure, dislocations are dramatically reduced or completely eliminated, because the step which typically causes dislocations, namely the high dose ion implantation step, has been replaced by a solid source diffusion step. Additionally, the gate poly and the source-drain regions of a given device are simultaneously doped with the same dopant without additional masks or costs.

While the invention has been particularly shown and described with reference to preferred exemplary embodiments thereof, it will be understood by those skilled in the art that the foregoing and other changes in form and details may be made therein without departing from the spirit and scope of the invention.

Accordingly, what is claimed is:

1. A dual channel CMOS device comprising:
   an IC chip having a first and second defined gates;
   a first layer abutting the first gate;
   a protective layer overlying the first layer;
   a second layer overlying the protective layer and abutting the second defined gate.

2. The device of claim 1, wherein the first layer is a doped glass and the second layer is an oppositely doped glass.

3. The device of claim 1, wherein the first layer is selected from the group consisting of phosphosilicate glass and arsenic silicate glass.

4. The device of claim 1, wherein the first layer is borosilicate glass.

5. The device of claim 1, wherein the first layer is spun on glass.

6. The device of claim 1, wherein the second layer is selected from the group consisting of phosphosilicate glass and arsenic silicate glass.

7. The device of claim 1, wherein the second layer is borosilicate glass.

8. The device of claim 1, wherein the second layer is spun on glass.

9. The device of claim 1, wherein the protective layer is nitride.

10. The device of claim 1, wherein the first and second defined gates each have a pair of opposing sidewalls and wherein the first, protective, and second layers overlie only the opposing sidewalls of the first defined gate and the second layer overlies only the opposing sidewalls of the second defined gate.

11. A dual channel CMOS device comprising:
    an IC chip including an n-well, a p-well and defined gates for the respective wells;
    a first layer abutting one of the defined gates;
    a protective layer overlying the first layer; and
    a second layer overlying the protective layer and directly contacting a surface of another defined gate.

12. The device of claim 11, wherein the second layer overlies both of the defined gates.

13. The device of claim 11, wherein first layer is doped spun on glass and the second layer is an oppositely doped spun on glass.

14. The device of claim 11, wherein the protective layer is nitride.

15. The device of claim 11, wherein the defined gates include a gate oxide and a gate electrode.

16. The device of claim 11, wherein the defined gates each include a pair of opposing sidewalls and the first, protective and second layers overlie only the opposing sidewalls of the first defined gate and the second layer overlies only the opposing sidewalls of the second defined gate.

* * * * *